United States Patent [19]
Kumakura

[11] Patent Number: 5,291,046
[45] Date of Patent: Mar. 1, 1994

[54] SEMICONDUCTOR MEMORY DEVICE
[75] Inventor: Sinsuke Kumakura, Kawasaki, Japan
[73] Assignee: Fujitsu Limited, Kawasaki, Japan
[21] Appl. No.: 831,963
[22] Filed: Feb. 6, 1992
[30] Foreign Application Priority Data
 Feb. 8, 1991 [JP] Japan .................. 3-039352
[51] Int. Cl.[5] ............................. H01L 29/68
[52] U.S. Cl. .................. 257/316; 257/435; 257/773
[58] Field of Search ............ 351/23.5; 257/316, 735, 257/773
[56] References Cited
U.S. PATENT DOCUMENTS
4,115,914 9/1978 Harari .
4,758,869 7/1988 Eitan et al. ................. 357/23.5
4,988,635 1/1991 Ajika et al. .................. 357/23.5
5,021,848 6/1991 Chiu .......................... 357/23.5

FOREIGN PATENT DOCUMENTS
0409107 1/1991 European Pat. Off. .

Primary Examiner—Edward Wojciechowicz
Attorney, Agent, or Firm—Staas & Halsey

[57] ABSTRACT

A control gate formed on top of an insulation layer over a floating gate for a transistor element of a memory cell in a redundancy ROM is shaped in a form covering not only the top but also the sides of the floating gate. A drain electrode wiring conventionally connected through a well is directly connected to a drain diffusion area. This enables the redundancy ROM to be miniaturized and the voltage fall at the edge of a drain diffusion area to be reduced.

10 Claims, 7 Drawing Sheets

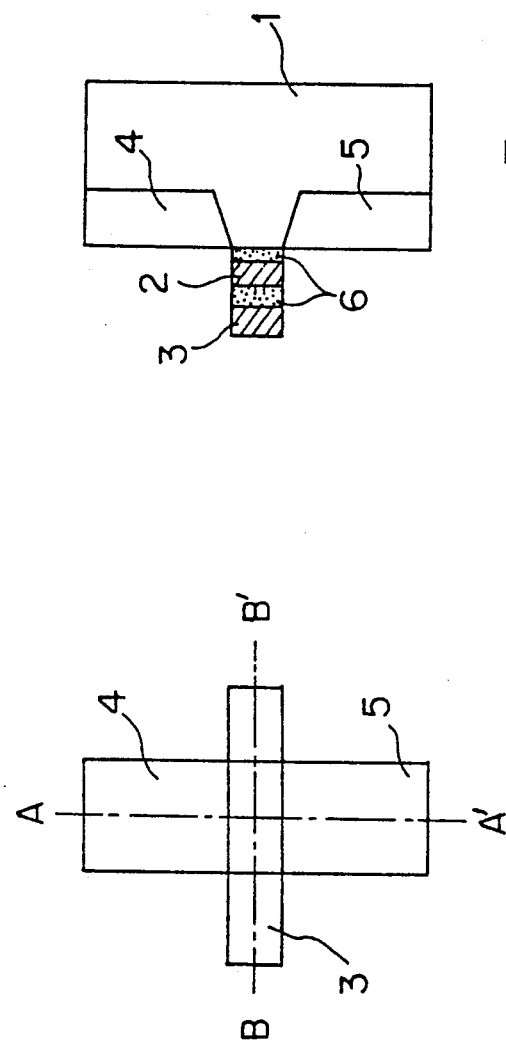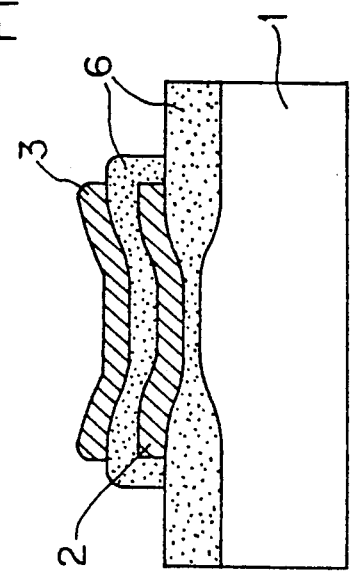

SEMICONDUCTOR MEMORY DEVICE

BACKGROUND OF THE INVENTION

1. Field of the Invention

This invention pertains to a semiconductor memory such as an EPROM (Erasable and Programmable Read Only Memory), and more particularly to improvement and compaction of a memory cell transistor of a ROM (Read Only Memory) for a non-volatile data storage provided in such a semiconductor memory.

2. Description of the Related Arts

EPROMs are widely known as typical non-volatile semiconductor memory devices.

Because EPROMs can hold stored data semipermanently as well as erase and overwrite them, they are used widely e.g. for firmware of systems having a lot of anticipated changes, systems on which programs are built upon by taking the compatibility with other systems into consideration, and systems in which many changes occur in the program specification.

A memory cell of an EPROM comprises a single transistor called a memory cell transistor.

FIGS. 1A, 1B and 1C are the top view and cutaways of an exemplary memory cell transistor of a conventional EPROM in a memory cell transistor.

More specifically, FIG. 1A shows a top view of a conventional memory cell transistor of an EPROM cell, FIG. 1B shows the A—A' cutaway of the memory cell transistor shown in FIG. 1A, and FIG. 1C shows the B—B' cutaway of the same.

As shown in FIG. 1B, a memory cell transistor comprises an N+ type source diffusion area 5 and an N+ type drain diffusion area 4 on the surface of a P type Si (silicon) substrate 1. On top of its channel formed between the N+ type source diffusion area 5 and the N+ type drain diffusion area 4, it has a layered structure comprising an insulation film 6, a floating gate 2 made of polysilicon, another insulation film 6 and a control gate 3. Therefore, the capacitance of the floating gate 2 and that of the control gate 3 are coupled through such an insulation film 6.

As such, a memory cell transistor of an EPROM has a structure in which a floating gate is attached under a gate of an N-channel MOS transistor (corresponding to the control gate3).

An ultraviolet ray radiation energizes electrons stored in the floating gate 2 of a memory cell transistor having the above structure, which causes the electron to be emitted out of the floating gate 2. As a result, the electrons of the floating gate 2 become void and data are erased.

In this state, a simultaneous application of a high voltage to the control gate 3 and the N+ type drain diffusion area 4 causes an avalanche breakdown phenomenon near the N+ type drain diffusion area 4 of the channel. The floating gate 2 captures some of the hot electrons charged with high energy near the N+ type drain diffusion area 4.

The electrons consequentially stored in the floating gate 2 raise the threshold voltage of the memory cell transistor controlled by the control gate 3. This prevents the memory cell transistor from becoming conductive despite an application of a proper readout voltage, such as five volts [5V], to the control gate 3, thereby preventing a datum from being written in erroneously.

Meanwhile, since the floating gate 2 does not store electrons when data have been erased, an application of the proper readout voltage, such as five volts [5V], to the control gate 3 causes the memory cell transistor to become conductive. A further application of another predetermined voltage, such as one volt [1V], to the N+ type drain diffusion area 4 causes the readout current to flow in the memory cell transistor.

Thus, the correspondence between the ON (conductance) and OFF (non-conductance) states of the memory cell transistor and the binary data comprising zero [0] and one [1] enables the memory cell transistor to store the binary data.

FIGS. 2A, 2B and 2C are a block diagram and circuit diagrams of an EPROM with a redundancy ROM.

FIG. 2A schematically shows an example of the entire configuration of a conventional semiconductor memory device.

An actual EPROM arrays a plurality of memory cell transistors, such as ones shown in FIG. 1, in a matrix form.

In FIG. 2A, a memory cell array 11 comprises a predetermined number of memory cell transistors $T_{00}$, $T_{01}$, ...; $T_{10}$, $T_{11}$, ...; and $T_{n0}$, $T_{n1}$, ..., among which memory cell transistors $T_{n0}$, $T_{n1}$, ... form redundant circuits.

A row address buffer 12 outputs to a row decoder 13 internal row address signals A0, $\overline{A0}$, A1, $\overline{A1}$, ..., and Am, $\overline{Am}$ by reshaping the waveform of and inverting the inputted row address signals A0 through Am.

The row decoder 13 selects an appropriate word line, e.g. $WL_0$, determined by the above internal row address signals upon their receipt. It sets the voltage of the selected word line, which is $WL_0$, to a high level and sets those of all other unselected word lines, which are designated as $WL_1$ through $WL_n$, to a low level, for example.

Among the above described (n+1) word lines $WL_0$, $WL_1$, ..., and $WL_n$, word line $WL_n$ is connected to the output side of a match detecting circuit 19 and is selected by an output from the match detecting circuit 19.

A write-in direct current power source $V_{pp}$ sets selected word lines $WL_0$, $WL_1$, ... e.g. to twelve point five volts [12.5V] when data are written, while a readout direct current power source $V_{cc}$ sets them e.g. to five volts [5V] when data are read.

Each of the word lines $WL_i$ (i=0, 1, ..., and n) is connected to the control gate 3 of a corresponding one of the above plurality of memory cell transistors $T_{i0}$, $T_{i1}$, ...

A column address buffer 22 outputs to a column decoder 23 internal column address signals $\overline{An}$, ..., and Ap, $\overline{Ap}$ by reshaping the waveform of and inverting the inputted column address signals An through Ap.

The column decoder 23 selects an appropriate bit line, e.g. $BL_0$, determined by the above internal column address signals upon their receipt. It sets the gate voltage of a transfer gate transistor, e.g. $TS_0$, connected to the selected bit line, which is $BL_0$, to a high level and sets that of another transfer gate transistor, e.g. $TS_1$, connected to the other unselected bit line, which is designated as $BL_1$, to a low level, for example.

Also, the control gate 3 of each of the memory cell transistors $T_{00}$, $T_{01}$, ...; $T_{n0}$, $T_{n1}$, ... of the memory cell array 11 is connected to the corresponding one of the word lines $WL_0$ through $WL_n$. The floating gate 2 of each of the memory cell transistors $T_{00}$, $T_{01}$, ...; $T_{n0}$, $T_{n1}, \ldots$ of the memory cell array 11 is surrounded by the corresponding insulation film 6 shown in FIG. 2A.

When a datum "zero [0]" is written into a particular memory cell transistor $T_{00}$, the column decoder 23 selects bit line $BL_0$, the row decoder 13 selects word line $WL_0$, and the write-in direct current power source $V_{pp}$ applies its high voltage, which is twelve point five volts [12.5V] in this example, to the control gate 3 of memory cell transistor $T_{00}$. Also, at this time, a write-in circuit 15 energizes memory cell transistor $T_{00}$ by setting the voltage on its output side to a high level (e.g. between seven volts [7V] and eight volts [8V] on receiving a write-in datum (e.g. "zero [0]") through a data input buffer 14. The floating gate 2 of memory cell transistor $T_{00}$ stores hot electrons charged with high energy generated by the avalanche breakdown phenomenon near the $N^+$ type drain diffusion area 4. Memory cell transistor $T_{00}$ to which the write-in datum (e.g. "zero [0]") is thus written does not allow a current to flow, even if the readout direct current power source $V_{cc}$ applies the predetermined readout voltage, which is five volts [5V] in this example, to the control gate 3 through word line $WL_0$ when its datum is read.

Consequently, memory cell transistor $T_{00}$ allows its stored datum ("zero [0]" in this example) to be read by having a sense amplifier 16 and a data output buffer 17 detect its non-conductive state.

Meanwhile, when the datum "one [1]" is written in a predetermined memory cell transistor (e.g. $T_{00}$), the write-in circuit 15 puts its output side in an electrically floating state. When a datum is written, memory cell transistor $T_{00}$ is not energized and its floating gate 2 stores no electron.

Therefore, memory cell transistor $T_{00}$ to which the datum "one [1]" is written is energized by applying the above predetermined readout voltage to its control gate 3 through word line $WL_0$ when its datum is read. Also, at this moment, an application of a predetermined voltage (e.g. two volts [2V]) to its $N^+$ type drain diffusion area 4 through bit line $BL_0$ causes a predetermined readout current to flow in memory cell transistor $T_{00}$. As such, the datum "one [1]" stored in memory cell transistor $T_{00}$ is read out by having the sense amplifier 16 connected to bit line $BL_0$ output a detection of a voltage fall caused by the readout current.

Also, a redundancy ROM 18 stores the address signal corresponding to the address of a bad cell in the memory cell array 11 (which is the row address of the bad cell in this case) and outputs the address signal to the match detecting circuit 19.

The match detecting circuit 19 selects word line $WL_n$ and halts the operation of the row decoder 13, when the row address buffer 12 outputs the row address signal corresponding to the address of a bad cell.

FIGS. 2B and 2C are circuit diagrams showing the exemplary internal configuration of the redundancy ROM 18.

More specifically, FIG. 2B shows the circuit configuration of a fuse ROM having a fuse 18a made of polysilicon. Ordinarily, a transistor 18c receives at its gate a gate signal Sc at a low level, remains non-conductive, and its output signal (ROM signal) from OUT on the output side is at a high level, i.e. a datum being "one [1]". When the gate signal Sc is at a high level, (i.e. when a severance signal is supplied,) transistor 18c is energized and the fuse 18a is dissolved by heat. Then, a pull-down resistor 18b causes the output signal from OUT on the output side to be at a low level, i.e. a datum being "zero [0]". By providing fuse ROMs having such a circuit configuration in the number of bits of the row addresses, the address of a bad cell is memorized. Yet, a destruction type memory device utilizing a heat dissolution of a fuse has the disadvantage of low reliability due to a possible reconnection of the dissolved fuse.

FIG. 2C shows the circuit configuration of a redundancy ROM comprising a transistor with a floating gate recently used as a memory cell of an EPROM.

In this case, a receipt at its gate of five volts [5V] from the readout direct current power source $V_{cc}$ energizes a transistor 18d, and the signal from OUT on its output side is at a low level, i.e. a datum being "zero [0]". An application of the gate signal Sc at a high voltage (e.g. twelve point five volts [12.5V]) to the gate of transistor 18d causes its floating gate to store electrons, thereby making it non-conductive. A pull-up resistor 18e causes the output signal from OUT on the output side to be at a high level, i.e. a datum being "one [1]".

A use of such a non-destruction type memory element enables a highly reliable redundancy ROM to be structured.

Generally, a semiconductor memory device such as an EPROM erases its data written on its memory cell array in the body of the EPROM. In doing so, it eliminates electrons stored in the floating gate of a memory cell transistor. A radiation of strong ultraviolet rays over an entire chip through the upper side of a silicon dioxide surface allows the electrons to be discharged.

However, when data written in the memory cell array are erased in this manner, it is necessary to avoid erasing, by the strong irradiated ultraviolet ray, data (indicating the address of a bad cell) written in the memory cell transistor (such as transistor 18d shown in FIG. 2C) forming the redundancy ROM 18. Thus, conventionally, so as to prevent the ultraviolet ray from erasing data stored in the redundancy ROM, the surface of a memory cell transistor, i.e. the insulation film 6, forming the redundancy ROM is covered with shield coating 35 e.g. made of aluminum, as shown in FIG. 3A.

Next, FIGS. 3A and 3B are referred to in explaining the configuration of a memory cell transistor of a conventional redundancy ROM 18.

Parts shown in FIGS. 3A and 3B which are identical to those shown in other drawings have the same numbers.

FIG. 3A shows the A—A' cutaway of a memory cell transistor of a conventional redundancy ROM.

In FIG. 3A, the $N^+$ type drain diffusion area 4, the $N^+$ type source diffusion area 5, the floating gate 2 and the control gate 3 on top of the P type silicon substrate 1 form an EPROM transistor in a redundancy ROM 18. An $N^-$ type union conductive well 31 ordinarily formed in a CMOS type integrated circuit is used to electrically connect the $N^+$ type drain diffusion area 4 with an $N^+$ type diffusion area 32, which is for drain terminal connection. Further, a drain terminal 36 is formed of aluminum. A $P^+$ type diffusion area 33 in the $N^-$ type union conductive well 31 is provided between the $N^+$ type drain diffusion area 4 and the $N^+$ type diffusion area 32, which is for drain terminal connection. The $P^+$ type diffusion area 33 is connected to an edge of the shield coating 35.

A field oxide surface and a PSG (Phospho-Silicate Glass) surface on the P type silicon substrate 1 form the insulation film 6. A contact part 35b of the shield coating 35 made of aluminum is connected to the $N^+$ type source diffusion area 5 to function as a source terminal.

Another contact part 35a of the shield coating 35 on the left hand side is connected to the P+ type diffusion area 33 provided in the N− type union conductive well 31. With such a connecting configuration, the shield coating 35 completely shields the memory cell transistors in the redundancy ROM 18, thereby enabling the contact part 35a to prevent the ultraviolet ray (shown as UV in FIG. 3A) irradiating the body of the EPROM from spilling over to the inside of the memory cell transistors.

The area covered by the shield coating 35 in a memory cell transistor of the redundancy ROM 18 having the above configuration need not be too large. The distance extending to the left hand side of the N+ type source diffusion area 5 need only be about a few tens of microns. Meanwhile, the N− type union conductive well 31 electrically connects the N+ type drain diffusion area 4 with the N+ type diffusion area 32 for drain terminal connection, thereby forming an electric link from the drain terminal 36 to the N+ type drain diffusion area 4. A source terminal 35c in the shield coating 35 in the memory cell transistor shown in FIGS. 3A and 3B is connected to the P+ type diffusion area 34 for contacting, thereby covering the surface of the P type silicon substrate 1 and the shield coating 35.

FIG. 3B is a top view of the memory cell transistor shown in FIG. 3A.

As described above, the P type silicon substrate 1 of the memory cell transistor touches, in the N− type union conductive well 31, the contact part 35a of the shield coating 35. It also touches, in the P+ type diffusion area 33 accompanied by the P+ type diffusion area 34, the shied coating 35 at its left and right sides, except for a lead part D of the control gate 3, of the P type silicon substrate 1 for shield. These are for preventing an ultraviolet ray from entering into the memory cell transistor. Although it is impossible to completely encapsulate the lead part D, the spacing between the control gate 3 and the surface of the P type silicon substrate 1 is extremely small, approximately at a few hundred angstroms. Therefore, the intrusion of an ultraviolet ray through the minimal spacing is almost negligible.

FIG. 4A shows an example of the form of the control gate 3 and the contact part 35a of the shield coating 35, which are illustrated in FIGS. 3A and 3B.

In reality, the contact part 35a in the lead part D is shaped into the form shown in FIG. 4A, and the control gate 3 is three-dimensionally reshaped to match the conclave. Thus, the intrusion of the ultraviolet ray is further restricted to almost nil.

FIG. 4B shows an equivalent circuit of an EPROM memory cell.

A predetermined voltage is applied to the drain terminal 36. The N+ type source diffusion area 5 is connected to the ground terminal. The N− type union conductive well 31 forms a drain parasitic resistance between the drain terminal 36 and the N+ type drain diffusion area 4.

The width of the N− type union conductive well 31 constrains the miniaturization of the redundancy ROM 18 conventionally configured as shown in FIG. 3. That is, the redundancy ROM 18 causes the N− type union conductive well 31 to connect the N+ type drain diffusion area 4 of a memory cell transistor with an external terminal, so as to prevent an undesirable intrusion of an ultraviolet ray into the memory cell transistor. However, when the ratio of impurities in the N− type union conductive well 31 is relatively low, the parasitic resistance to the N− type union conductive well 31 is large and it is feared that the voltage applied to the edge of the N+ type drain diffusion area 4 of the memory cell transistor falls.

For instance, when the voltage applied to the edge of the N+ type drain diffusion area 4 falls significantly, a write-in to the memory cell transistor is not conducted effectively. Therefore, so as to inhibit the voltage applied to the edge of the N+ type drain diffusion area 4 from falling and the parasitic resistance to the edge of the N+ type drain diffusion area 4 from rising, the N− type union conductive well 31 must be ensured to have a sufficient width. However, this prevents the redundancy ROM 18 from being miniaturized.

The problem of a difficulty in miniaturizing the redundancy ROM 18 becomes more critical in reducing the overall dimensions of a semiconductor memory device, because the differences in the dimensions of a memory cell array and those of a memory cell transistor become more apparent as the memory becomes more highly integrated.

SUMMARY OF THE INVENTION

This invention conceived with the above background aims at crashing the overall size of a semiconductor memory device having a non-volatile memory by realizing a memory cell of a redundancy ROM configured to have a lower voltage fall at the drain terminal even when the width of a memory cell transistor of a redundancy ROM is reduced, while preserving the advantages of a conventional memory cell transistor of a redundancy ROM.

This invention causes a control gate to cover not only the upper surface of a floating gate but also the side thereof, such that the control gate prevents an intrusion of an ultraviolet ray into the floating gate. This invention also causes a blind coating to be formed by extending a part of the electrode wiring for the source area over to the insulation film covering the control gate.

A direct electrical connection of the drain terminal of a memory cell transistor of a redundancy ROM with an external terminal without through a union conductive well, unlike an indirect electrical connection of a conventional memory cell transistor through a union conductive well, prevents the voltage applied at the drain terminal from falling and thus enables the overall dimensions of a redundancy ROM to be crashed.

Also, because a shield coating cannot contact with the drain electrode wiring, the spacing formed between them invites an intrusion of an ultraviolet ray. A complete coverage of the control gate of a memory cell transistor over the floating gate prevents an ultraviolet ray from irradiating the floating gate. A loss of the electric charge stored in the floating gate occasioned by an ultraviolet ray intrusion causes the datum stored in a memory cell transistor to be erased. But the measures taken by this invention is effective in preventing unintended data from being deleted accidentally, thus preserving data integrity.

BRIEF DESCRIPTION OF THE DRAWINGS

FIG. 1A shows a top view of a conventional memory cell transistor of an EPROM cell;

FIG. 1B shows the A—A' cutaway of the memory cell transistor shown in FIG. 1A;

FIG. 1C shows the B—B' cutaway of the memory cell transistor shown in FIG. 1A;

DESCRIPTION OF THE PREFERRED EMBODIMENTS

The following is a description of the preferred embodiments of this invention.

Figure 5A:
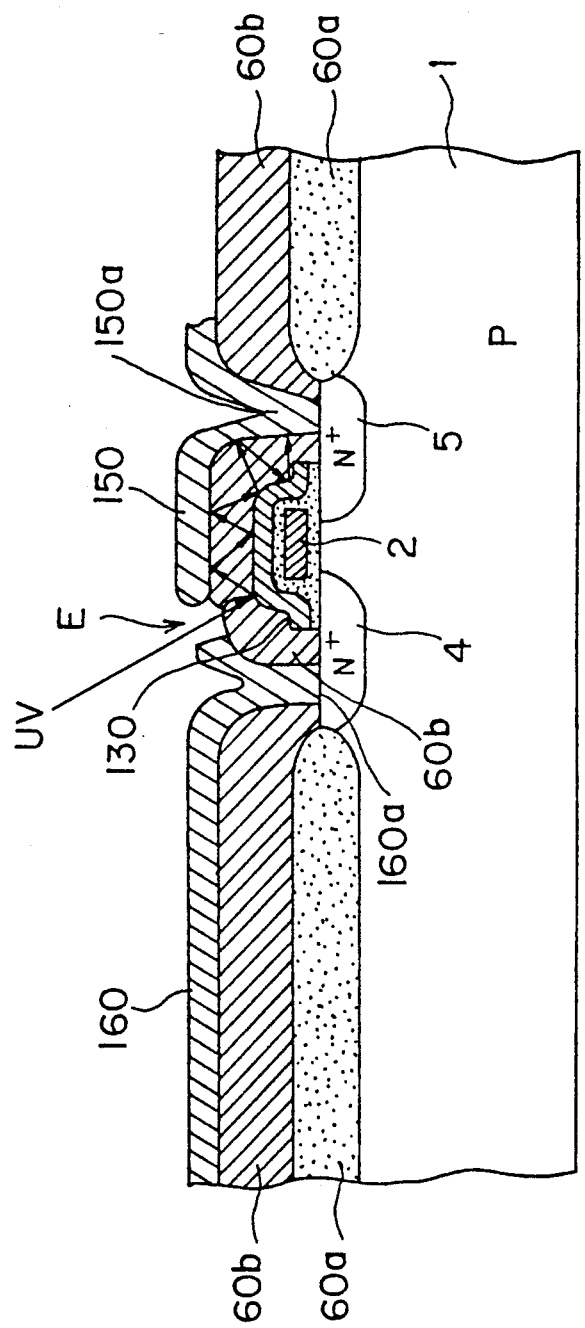
FIG. 5A shows the X—X' cutaway of a memory cell transistor pursuant to this invention.

FIG. 5A shows the X—X' cutaway of a memory cell transistor pursuant to this invention.

Figure 5B:
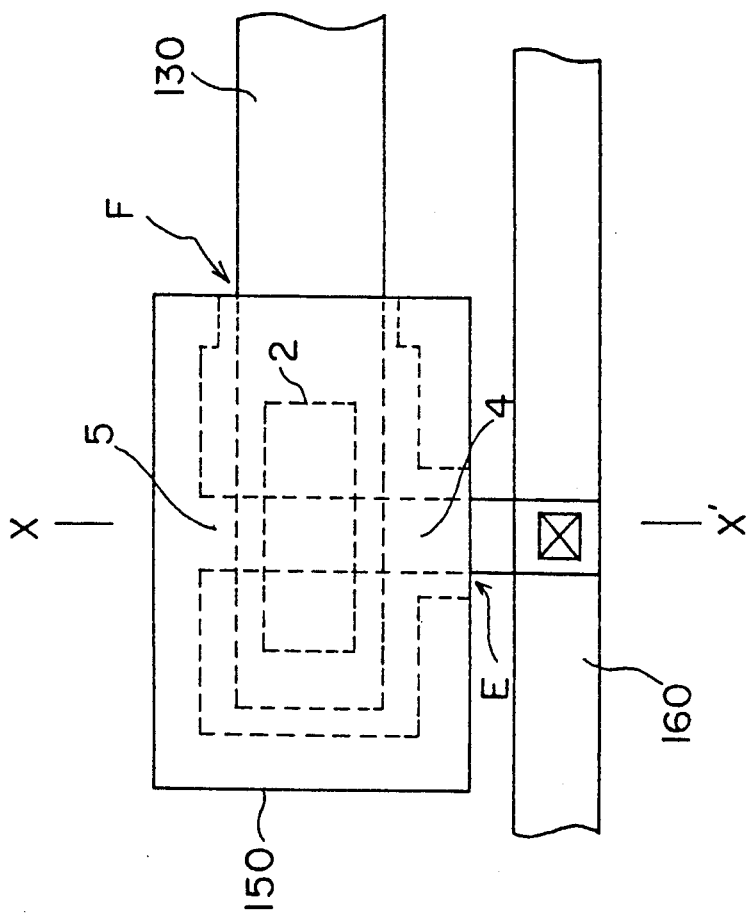
FIG. 5B shows a top view of the memory cell transistor shown in FIG. 5A.

FIG. 5B shows a top view of the memory cell transistor shown in FIG. 5A.

Figure 2A:
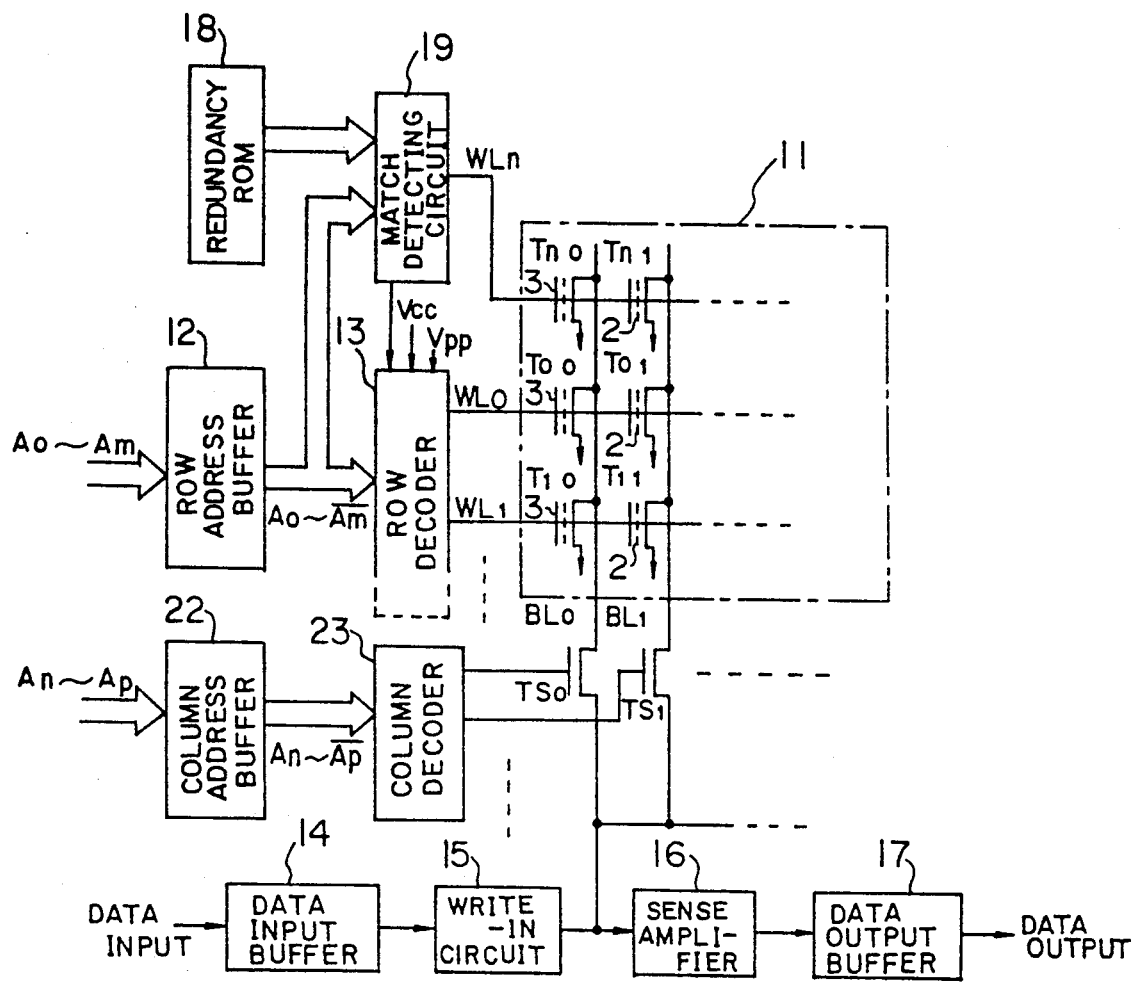
FIG. 2A schematically shows an example of the entire configuration of a semiconductor memory device.
Figures 2B, 2C:
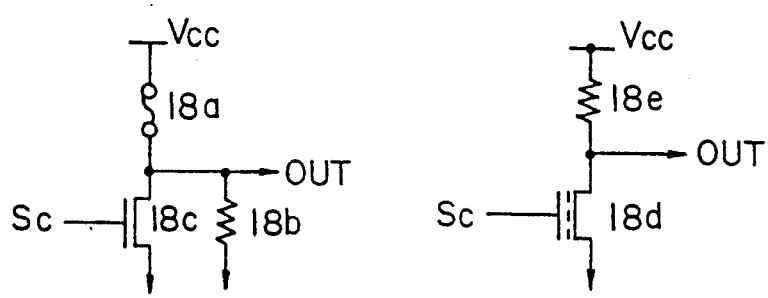
FIG. 2B shows the circuit configuration of a fuse ROM.
FIG. 2C shows the circuit configuration of a redundancy ROM comprising a transistor with a floating gate recently used as a memory cell of an EPROM.
Figure 3A:
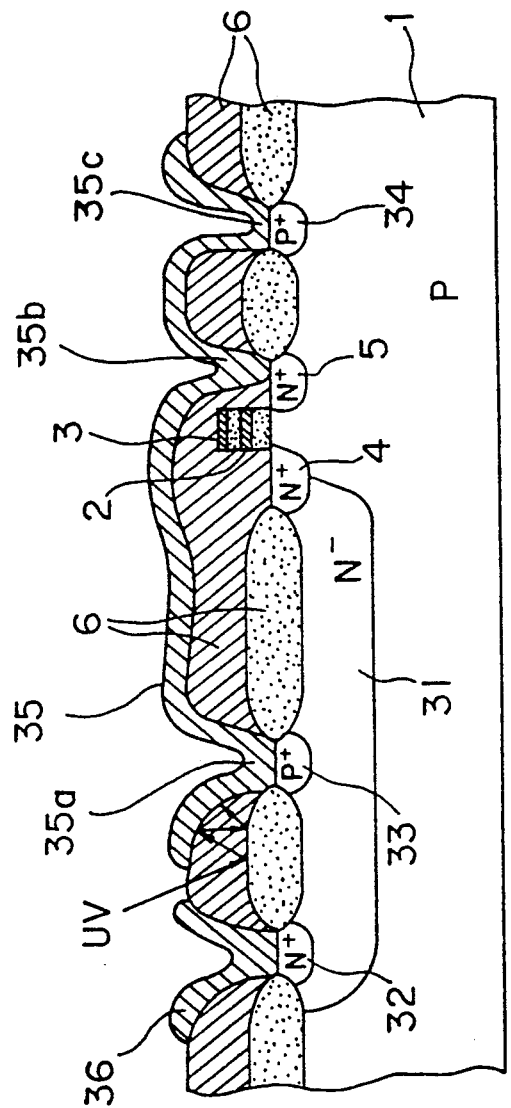
FIG. 3A shows the A—A' cutaway of a memory cell transistor of a conventional redundancy ROM.
Figure 3B:
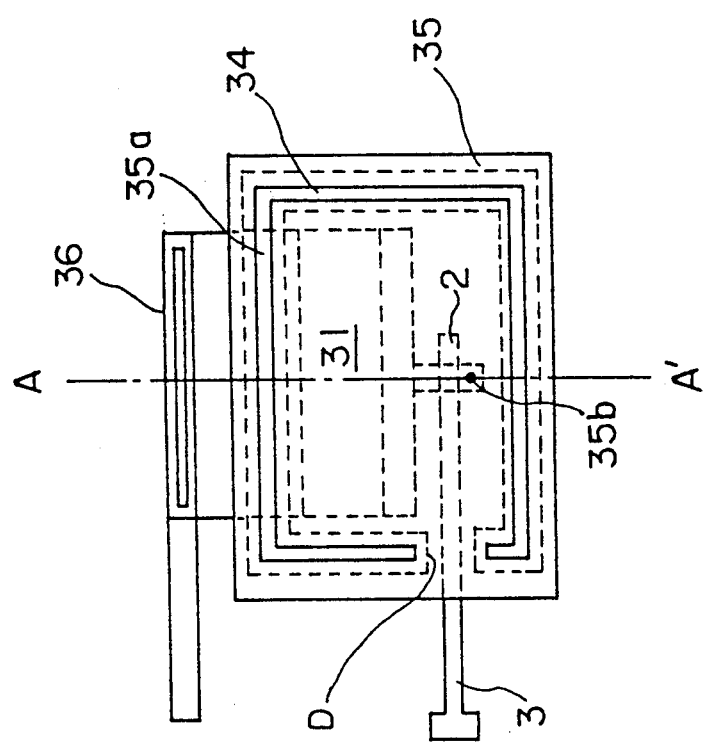
FIG. 3B shows a top view of the conventional memory cell transistor shown in FIG. 3A.
Figure 4A:
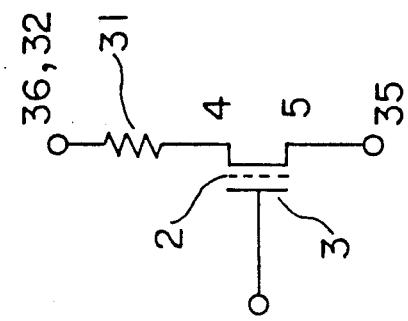
FIG. 4A shows an example of the form of the control gate 3 and the contact part 35a of the shield coating 35, which are illustrated in FIGS. 3A and 3B.
Figure 4B:
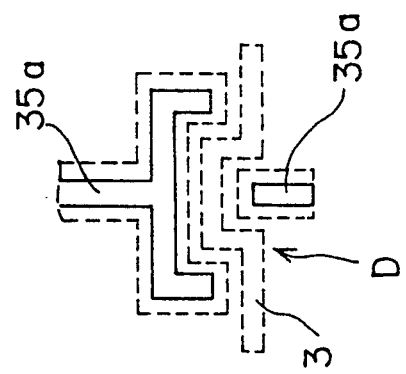
FIG. 4B shows an equivalent circuit of an EPROM memory cell.

The parts shown in FIGS. 5A and 5B which are the same as those shown in FIGS. 3A and 3B have the same numbers.

That is, as shown in FIG. 5A, the surface of the P type silicon substrate 1 has the N+ type drain diffusion area 4 spaced a predetermined interval from the N+ type source diffusion area 5.

Surrounded by a insulation film 60b made of PSG (Phospho-Silicate Glass), the floating gate 2 made e.g. of polysilicon is formed on top of the channel formed between the N+ type drain diffusion area 4 and the N+ type source diffusion area 5 on the P type silicon substrate 1.

Further, a control gate 130 made of polysilicon is formed to cover the top and sides of the floating gate 2 through the insulation film 60b, which entirely blankets the top and sides of the control gate 130.

A source electrode wiring 150 made of aluminum covers the insulation film 60b and the N+ type source diffusion area 5 with a part of it (a contact part 150a) connected to the N+ type source diffusion area 5.

A drain electrode wiring 160 made of aluminum covers the insulation film 60b and the N+ type drain diffusion area 4 with a part of it (a contact part 160a) connected to the N+ type drain diffusion area 4.

On the opposite side of the channel forming area of the N+ type source diffusion area 5 and the N+ type drain diffusion area 4, an insulation film 60a made e.g. of silicon dioxide forms a blanket on the P type silicon substrate 1.

The insulation film 60a is a field oxide film or a gate oxide film formed by oxidizing the surface of the P type silicon substrate 1 with heat. The insulation film 60b is formed by extending a PSG film on top of the insulation film 60a, for example.

As shown in FIG. 5B, the source electrode wiring 150 for shield coating in the memory cell transistor configured as above cannot tightly couple with the lead part of the drain electrode wiring 160 and that of the control gate 3. As a result, gaps E and F are formed respectively on top of the insulation film 60b on the control gate 130 and between the control gate 130 and the N+ type source diffusion area 5, as shown in FIGS. 5A and 5B. However, because the surface spacing of the P type silicon substrate 1 is minuscule approximately a few hundred angstroms, the intrusion of an irradiated ultraviolet ray (shown as UV in FIG. 5A) through gap F is negligible.

Also, the intrusion of an irradiated ultraviolet ray through gap E is almost completely shielded because the control gate 130, unlike a conventional control gate 3, is formed to provide the complete coverage of not only the top but also the sides of the floating gate 2.

In order to completely block the ultraviolet ray from entering through gap E, it is desirable to three-dimensionally contour the control gate 130, the contact part 160a of the drain wiring electrode 160 with the N+ type drain diffusion area 4, and the N+ type drain diffusion area 4.

As described above, because the drain electrode of a memory cell transistor in a redundancy ROM 18 is structured to connect directly with the electrode wirings and not through the N− type union conductive well 31, this invention is effective in preventing the drain voltage applied to the edge of the N+ type drain diffusion area 4 from falling and in crashing the dimensions of the memory cell transistor, thereby enabling the redundancy ROM 18 to be miniaturized.

Also, because the control gate 130 of a memory cell transistor is shaped to cover not only the top but also the sides of the floating gate 2, an ultraviolet ray irradiated into the floating gate 2 for erasing data stored in the body of an EPROM is completely shut from intruding inside the memory cell transistor, thus securing a datum, e.g. the address of a bad cell, set in a memory cell transistor of a redundancy ROM in the EPROM when data are erased from the body of the EPROM.

In addition, because this invention can be embodied by shaping accessory circuits with a CMOS EPROM through a standard CMOS EPROM manufacturing process, no additional steps are necessary in fabrication. A mere substitution of the mask pattern will suffice, and the same production efficiency as before can be maintained.

Although the N+ type drain diffusion area 4 and the N+ type source diffusion area 5 are used as the drain and the source, they can be of the P type (including the P+ type). Also, the position of the N+ type drain diffusion area 4 can be exchanged for that of the N+ type source diffusion area 5 shown in FIGS. 5A and 5B, in which case an N type silicon substrate is used in lieu of the P type silicon substrate 1.

Also, although the above explanation assumes the storage of hot electrons generated by an avalanche breakdown in the floating gate 2, it is possible to reduce the film thickness of the insulation layer under the floating gate 2 enough to allow partial tunneling, such that the tunneling performs the injection into and emission out of the floating gate 2.

Further, it is possible to replace the insulation layer made of a silicon dioxide film under the floating gate 2 with that made of a silicon nitride film. Because a silicon nitride film has a lower voltage barrier for the electrons on a silicon substrate than a silicon dioxide film, it allows hot electrons with lower energy to be injected into and emitted out of the floating gate 2 more smoothly. In this case, an application of a ten volt [10V] pulse to the N+ type drain diffusion area 4 and the control gate 130 enables electrons to be injected into the floating gate 2, and an application of a ten volt [10V] pulse to the N+ type drain diffusion area 4 and that of a minus five volt [−5V] pulse to the control gate 130 enable electrons to be emitted from the floating gate 2.

Furthermore, it is conceivable to use high melting temperature metals, such as molybdenum (Mo), tungsten (W), titanium (Ti), and platinum (Pt), with reduced gate electrode resistance, instead of polysilicon. Alternatively, it is conceivable to use either silicide made by reacting any of these metals with polysilicon or polycide having two [2] layers of silicide and polysilicon.

What is claimed is:

1. A semiconductor memory device whose memory cell is a transistor element, comprising:
    a source area and a drain area formed on the surface of a semiconductor substrate;
    a floating gate provided on top of a first insulation layer over the area between said source area and said drain area;
    a control gate provided on top of a second insulation layer over the top and sides of the floating gate such that said control gate prevents intrusion of a ray of light into said floating gate;
    a first wiring layer forming an electrode wiring of one of said source area or said drain area by contacting said one of said source area or said drain area, said first wiring layer being arranged to define a blind coating by extending over a third insulation layer covering said control gate; and
    a second wiring layer provided on top of said third insulation layer and electrically isolated from said first wiring layer, a part of said second wiring layer contacting the other of said drain area or said source area, wherein a gap between said first wiring layer and said second wiring layer is positioned above either said source area or said drain area, and said control gate is positioned between said gap and said floating gate and extends over the top and sides of said floating gate such that said control gate prevents a ray of light passing through said gap from striking said floating gate.

2. The semiconductor memory device according to claim 1, wherein:
    said insulation layer provided under said floating gate is made of an oxide film.

3. The semiconductor memory device according to claim 1, wherein:
    said insulation layer provided under said floating gate is made of a nitride film.

4. The semiconductor memory device according to claim 1, wherein:
    carriers are stored in said floating gate by injecting into said floating gate hot carriers generated by an avalanche breakdown occurring near said drain area.

5. The semiconductor memory device according to claim 2, wherein:
    carriers are stored in said floating gate by injecting into said floating gate hot carriers generated by an avalanche breakdown occurring near said drain area.

6. The semiconductor memory device according to claim 3, wherein:
    carriers are stored in said floating gate by injecting into said floating gate hot carriers generated by an avalanche breakdown occurring near said drain area.

7. The semiconductor memory device according to claim 1, wherein:
    carriers are stored in and emitted from said floating gate by tunnel currents flowing from said floating gate to said drain area through said insulation layer under said floating gate.

8. The semiconductor memory device according to claim 2, wherein:
    carriers are stored in and emitted from said floating gate by tunnel currents flowing from said floating gate to said drain area through said insulation layer under said floating gate.

9. The semiconductor memory device according to claim 3, wherein:
    carriers are stored in and emitted from said floating gate by tunnel currents flowing from said floating gate to said drain area through said insulation layer under said floating gate.

10. A semiconductor memory device whose memory cell is a transistor element, comprising:
    a source area and a drain area formed on the surface of a semiconductor substrate;
    a floating gate provided on top of a first insulation layer over the area between said source area and said drain area;
    a control gate provided on top of a second insulation layer over the top and sides of the floating gate such that said control gate prevents intrusion of a ray of light into said floating gate;
    a first wiring layer forming an electrode wiring of one of said source area or said drain area by contacting said one of said source area or said drain area, said first wiring layer being arranged to define a blind coating by extending over a third insulation layer covering said control gate; and
    a second wiring layer provided on top of said third insulation layer and electrically isolated from said first wiring layer, a part of said second wiring layer contacting the other of said drain area or said source area, wherein a gap between said first wiring layer and said second wiring layer is positioned above said control gate.

* * * * *